SILICON CONTROLLED RECTIFIER LOCK-UP PROOF FLIPFLOP

Filed Feb. 9, 1965

INVENTOR,
Lowell D. Yates

BY: Harry M. Saragovitz, Edward J. Kelly & Herbert Berl

ATTORNEYS.

United States Patent Office 3,373,297

Patented Mar. 12, 1968

3,373,297
SILICON CONTROLLED RECTIFIER LOCK-UP PROOF FLIP-FLOP

Lowell D. Yates, El Paso, Tex., assignor to the United States of America as represented by the Secretary of the Army Filed Feb. 9, 1965, Ser. No. 431,482
3 Claims. (Cl. 307—252)

The invention described herein may be manufactured and used by or for the Government for government purposes, without the payment to me of any royalty thereon.

The inveniton relates to silicon controlled rectifier capacitor turn-off circuits and more particularly to such a circuit which will not lock-up or fail when the time interval between the turn-on pulse and the turn-off pulse becomes too short to store enough energy in the commutating capacitor to provide the related silicon controlled rectifier with a reverse voltage whereby the related silicon controlled rectifier will be placed in the off condition.

Prior art silicon controlled rectifier capacitor turn-off circuits have a common limitation, that is, such circuits will lock or fail when the time interval between the turn-on pulse and the turn-off pulse becomes too short to store enough energy in the commutating capacitor to extinguish the related silicon controlled rectifier. Therefore, these prior art silicon controlled rectifier circuits cannot be effectively used in control circuits which require that the turn-off pulse time be a function of the error in a feedback loop without supplementary logic to insure against minimum time displacement between the turn-on and the turn-off signals.

An object of the invention is a new and novel solid state control means employing silicon controlled rectifiers in combination with commutation means for precise control of electronic or electromechanical devices.

Another object of the invention is a unique tristable silicon controlled rectifier switch provided with alternate turn-off pulses and which reverts temporarily to bistable operation as coincidence is approached.

Another object of the invention is an improved silicon controlled rectifier flip-flop circuit which will not lock-up or fail with a widely variable load or with a widely varying time displacement between turn-on and turn-off signals.

Figure 1:
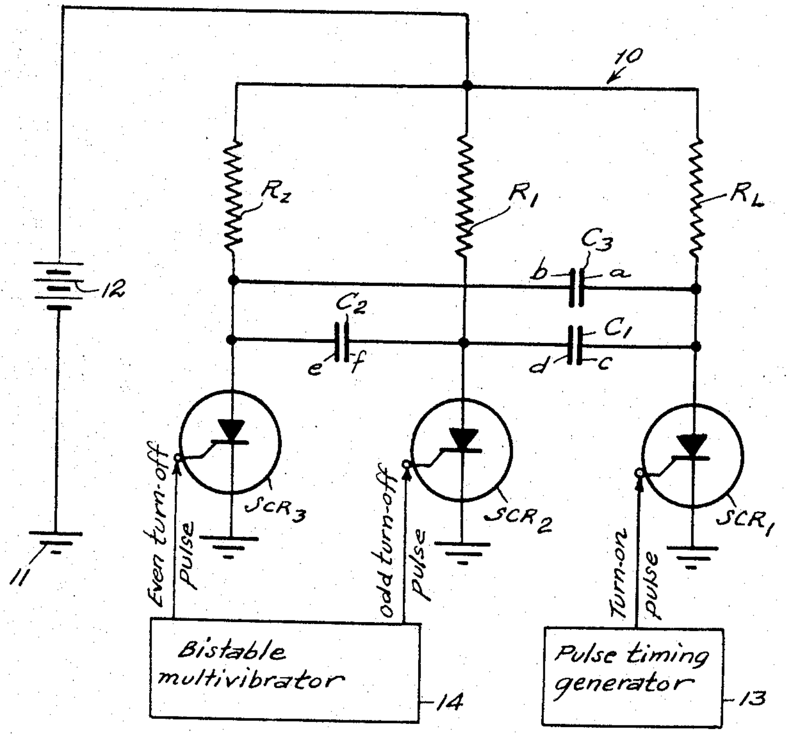
Figure 2:
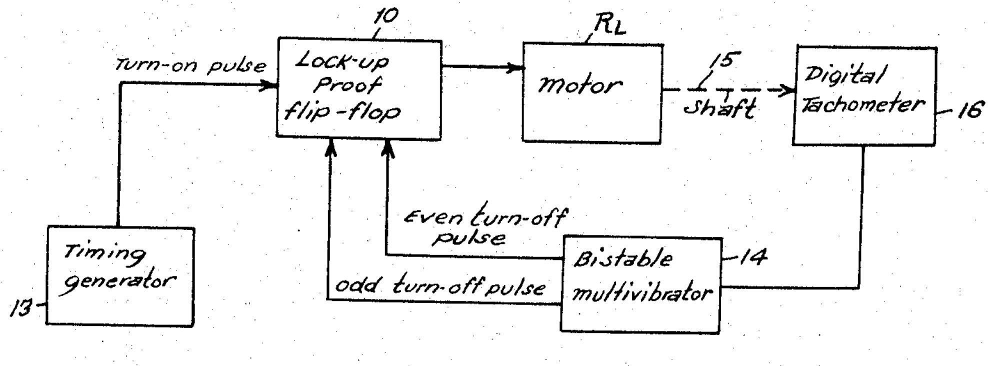

The specific nature of the invention as well as other objects and advantages thereof will clearly appear from the following description and accompanying drawings in which:

FIGURE 1 is a schematic diagram of the lock-up proof silicon controlled rectifier flip-flop of the invention; and FIGURE 2 is a block diagram illustrating a simplified application of the lock-up proof silicon controlled rectifier flip-flop in a motor velocity control system.

FIGURE 1 shows the circuit 10 of the tristable silicon controlled rectifier lock-up proof flip-flop of the invention wherein silicon controlled rectifiers $SCR_2$ and $SCR_3$ are the turn-off means which are pulse fired alternately, each in turn shorting capacitor $C_1$ or $C_3$ across silicon controlled rectifier $SCR_1$ and turning it off. The anode of $SCR_3$ is connected through resistor $R_2$ to the D-C power supply 12 which is returned to common circuit 11. The anode of $SCR_2$ is similarly connected to D-C power supply 12 through resistor $R_1$ and the anode of $SCR_1$ is connected to D-C power supply 12 through the device to be controlled as represented by resistor $R_L$ which may be an electric motor, or any electronic device. Commutation means of the flip-flop of the invention comprises capacitor $C_1$ which couples the anodes of $SCR_2$ and $SCR_1$, capacitor $C_2$ which couples the anodes of $SCR_2$ and $SCR_3$ and capacitor $C_3$ which couples the anodes of $SCR_1$ and $SCR_3$. The turn-on pulses applied to the gate of $SCR_1$ may be derived from a pulse timing generator as indicated by reference numeral 13. The even numbered turn-off pulses and the odd numbered turn-off pulses applied to the gates of $SCR_3$ and $SCR_2$, respectively, may be derived, for example, by means of a bistable multivibrator as indicated by reference numeral 14.

FIGURE 2 illustrates a simplified application of the invention wherein $R_L$ is a motor having its shaft 15 coupled to a digital tachometer 16 which produces the turn-off signals, digital pulses, which are coupled to a bistable multivibrator 14. The multivibrator divides the digital pulses producing the odd and even pulses applied to the gates of $SCR_2$ and $SCR_3$. The timing generator 13 produces the turn-on pulses which are applied to the gate of $SCR_1$.

In operation of the lock-up proof silicon controlled rectifier flip-flop, normally functioning in a tristable state, a first turn-on pulse is applied to the gate of $SCR_1$ causing power from D-C power supply 12 to be applied to the load $R_L$ and plate *a* of capacitor $C_3$ and plate *c* of capacitor $C_1$ to be shorted to near ground potential. The grounded plates *a* and *c* cause the capacitors $C_3$ and $C_1$ to charge to the potential of the D-C power supply 12, the grounded sides of capacitors $C_3$ and $C_1$ becoming negative. The first, odd numbered, turn-off pulse is then applied to the gate of $SCR_2$ whereby $SCR_2$ fires and capacitor $C_1$ is shorted across $SCR_1$. Since plate *c* of capacitor $C_1$ is now of negative polarity, this capacitor places a charge of reverse polarity across $SCR_1$ whereupon $SCR_1$ is extinguished and power for the load $R_L$ is cut off. At this point $SCR_1$ and $SCR_3$ are in a nonconducting state and $SCR_2$ shorts plate *d* and plate *f* of capacitors $C_1$ and $C_2$, respectively, to ground, the capacitors charging to the potential of the D-C power supply 12 and the grounded plates *d* and *f* assuming a negative polarity. Now a second turn-on pulse is applied to the gate of $SCR_1$ whereby $SCR_1$ fires and the positive side *c* of capacitor $C_1$ is shorted to ground, placing a charge of reverse polarity across $SCR_2$ and extinguishing it. Again plate *a* of capacitor $C_3$ and plate *c* of capacitor $C_1$ are placed at ground potential, negative, and capacitors $C_1$ and $C_3$ again charge to the potential of the D-C power supply 12. The even numbered turn-off pulse is now applied to the gate of $SCR_3$ causing $SCR_3$ to fire and capacitor $C_3$ to short across $SCR_1$ whereby $SCR_1$ is extinguished. Since $SCR_3$ is now in a conducting state, plates *e* and *b* of capacitors $C_2$ and $C_3$, respectively, are placed at ground, negative, potential and capacitors $C_2$ and $C_3$ charge to the potential of D-C power supply 12. A third turn-on pulse is now applied to the gate of $SCR_1$, firing $SCR_1$ and placing capacitor $C_3$ across $SCR_3$ whereby $SCR_3$ is extinguished.

The invention may be best understood by considering the following description of a complete cycle of operations involving a coincidence or near coincidence of a turn-on pulse and a turn-off pulse where the time interval between said pulses becomes too short to store enough energy in the commutating capacitor and which in prior art SCR flip-flops causes a lock-up. A turn-on pulse applied to the gate of $SCR_1$ causes $SCR_1$ to fire and power to be applied to the load $R_L$. Shortly thereafter or near coincidence, the first turn-off pulse is applied to the gate of $SCR_2$ causing $SCR_2$ to fire whereby capacitor $C_1$ is shorted across $SCR_1$. However, due to the short interval of time between these two pulses, $C_1$ has not sufficient time to store enough energy to extinguish $SCR_1$. Therefore $SCR_1$ and $SCR_2$ remain in a state of conduction or lock-up. At this point in time of the cycle $SCR_2$ grounds plate *f* of capacitor $C_2$ and $SCR_1$ grounds plate *a* of capacitor $C_3$ and then both capacitors charge to the potential of D-C power supply 12 with plates *a* and *f* assuming a negative polarity. The second turn-on pulse is now applied to the gate of $SCR_1$, but has no effect because $SCR_1$ is already in a state of conduction. Following the second turn-on pulse, a second turn-off pulse is applied to the gate of $SCR_3$ whereupon $SCR_3$ fires causing capacitors $C_2$ and $C_3$ to short across $SCR_2$ and $SCR_1$ extinguishing these two rectifiers whereupon the D-C power supply is disconnected from the load $R_L$. Next the third turn-on pulse is applied to the gate of $SCR_1$ causing it to fire whereby power is applied to the load $R_L$. The circuit now reverts to tristable operation as described in the aforegoing paragraph.

Although a specific embodiment of this invention has been illustrated and described, it will be understood that this is but illustrative and that various modifications may be made therein without departing from the spirit of this invention and the scope of the appended claims.

What is claimed is:

1. A tristable controlled rectifier lock-up proof flip-flop including turn-on pulse means and turn-off pulse means and which reverts temporarily to bistable operation when coincidence between a turn-on pulse and a turn-off pulse occurs comprising in combination, a D-C power supply, a first controlled rectifier, a second controlled rectifier, a third controlled rectifier, each of said controlled rectifiers provided with anode, cathode and gate elements, the anodes of said controlled rectifiers connected to the positive pole of said D-C power supply, the cathodes of said controlled rectifiers connected to the negative pole of said D-C power supply, first commutation means coupling the anodes of said first and second controlled rectifiers, second commutation means coupling the anodes of said second and third controlled rectifiers, third commutation means coupling the anodes of said first and third controlled rectifiers, said turn-on pulse means connected to the gate of said first controlled rectifier whereby signals are applied to said gate turning on said first controlled rectifier, said turn-off pulse means generating alternate pulses and having one of its terminals connected to the gate of said second controlled rectifier and the other of its terminals connected to the gate of said third controlled rectifier causing said second and third controlled rectifiers to alternately fire whereby said first controlled rectifier is accordingly extinguished.

2. The invention in accordance with claim 1 wherein an electrically responsive load is connected in series with the anode of said first controlled rectifier and said D-C power supply.

3. A tristable controlled rectifier lock-up flip-flop which reverts temporarily to bistable operation when coincidence between a turn-on pulse and a turn-off pulse occurs comprising in combination, a D-C power supply, a first controlled rectifier, a second controlled rectifier, a third controlled rectifier, each of said controlled rectifiers provided with anode, cathode and gate elements, an electrically responsive load in series with the anode of said first controlled rectifier and the positive pole of the D-C power supply, a resistor in series with each of the anodes of the second and third controlled rectifiers and positive pole of the D-C power supply, the cathodes of said controlled rectifiers connected to the negative pole of the D-C power supply, a first commutating capacitor coupling the anodes of the first and second controlled rectifiers, a second commutating capacitor coupling the anodes of the second and third controlled rectifiers, a third commutating capacitor coupling the anodes of the first and third controlled rectifiers, pulse generating means adapted to apply firing signals to the gate of said first controlled rectifier whereby said first controlled rectifier is caused to conduct and power is applied to said electrically responsive load, a second pulse generating means adapted to alternately apply firing signals to gates of said second and third controlled rectifiers driving these rectifiers into conduction which alternately extinguish said first controlled rectifier whereby power to said electrical responsive means is connected and disconnected, said third controlled rectifier operating in a response to a firing pulse applied to its gate to short the second and third commutating capacitors across and extinguishing said first and second controlled rectifiers when the interval of time between the firing signal applied to said first controlled rectifier and the firing signal applied to said second controlled rectifier is too short to charge said first commutating capacitor to an extinguishing voltage for said first controlled rectifier.

References Cited

UNITED STATES PATENTS

| | | | |
|---|---|---|---|
| 3,143,665 | 8/1964 | Smith | 307—88.5 |
| 3,167,664 | 1/1965 | Stascauage | 307—88.5 |
| 3,209,174 | 9/1965 | Cole | 307—88.5 |

ARTHUR GAUSS, *Primary Examiner.*

S. D. MILLER, *Assistant Examiner.*